(12) United States Patent
Lin (10) Patent No.: US 6,912,666 B2
(45) Date of Patent: Jun. 28, 2005

(54) INTERLEAVED DELAY LINE FOR PHASE LOCKED AND DELAY LOCKED LOOPS

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/731,779

(22) Filed: Dec. 9, 2003

(65) Prior Publication Data

US 2004/0120211 A1 Jun. 24, 2004

Related U.S. Application Data

(62) Division of application No. 09/652,632, filed on Aug. 31, 2000.

(51) Int. Cl.[7] ................................................ G06F 1/12
(52) U.S. Cl. .................. 713/401; 713/400; 713/500; 713/503; 713/600; 711/100; 711/105; 711/167; 711/170
(58) Field of Search ................................ 713/400, 401, 713/500, 600, 503; 711/100, 105, 167, 170, 4; 329/360; 327/138, 147, 149, 156, 158, 161; 716/6

(56) References Cited

U.S. PATENT DOCUMENTS

| 5,109,394 | A | | 4/1992 | Hjerpe et al. |
| 5,192,886 | A | | 3/1993 | Wetlaufer |
| 5,420,531 | A | * | 5/1995 | Wetlaufer ................ 327/270 |
| 5,544,203 | A | | 8/1996 | Casasanta et al. |
| 5,552,726 | A | | 9/1996 | Wichman et al. |
| 5,604,775 | A | | 2/1997 | Saitoh et al. |
| 5,638,010 | A | | 6/1997 | Adams |
| 5,808,478 | A | * | 9/1998 | Andresen ................ 326/31 |
| 5,844,954 | A | | 12/1998 | Casasanta et al. |
| 5,854,797 | A | | 12/1998 | Schwartz et al. |
| 5,923,715 | A | * | 7/1999 | Ono ........................ 375/376 |
| 6,011,732 | A | * | 1/2000 | Harrison et al. ........... 365/194 |
| 6,163,174 | A | | 12/2000 | Friedman et al. |
| 6,212,126 | B1 | | 4/2001 | Sakamoto |
| 6,265,916 | B1 | | 7/2001 | Ono et al. |
| 6,445,231 | B1 | * | 9/2002 | Baker et al. ............... 327/158 |
| 6,518,812 | B1 | * | 2/2003 | Sikkink et al. ............. 327/284 |

* cited by examiner

Primary Examiner—Lynne H. Browne
Assistant Examiner—Nitin C. Patel
(74) Attorney, Agent, or Firm—Thorp Reed & Armstrong, LLP (57) ABSTRACT

An interleaved delay line for use in phase locked and delay locked loops is comprised of a first portion providing a variable amount of delay substantially independently of process, temperature and voltage (PVT) variations while a second portion, in series with the first portion, provides a variable amount of delay that substantially tracks changes in process, temperature, and voltage variations. By combining, or interleaving, the two types of delay, single and dual locked loops constructed using the present invention achieve a desired jitter performance under PVT variations, dynamically track the delay variations of one coarse tap without a large number of delay taps, and provide for quick and tight locking. Methods of operating delay lines and locked loops are also disclosed.

5 Claims, 5 Drawing Sheets

INTERLEAVED DELAY LINE FOR PHASE LOCKED AND DELAY LOCKED LOOPS

CROSS-REFERENCE TO RELATED APPLICATIONS

The present invention is a divisional of U.S. application Ser. No. 09/652,632 entitled "An Interleaved Delay Line for Phase Locked and Delay Locked Loops" filed 31 Aug. 2000 and having common ownership.

BACKGROUND OF THE INVENTION

1. Field of the Invention

The present invention is directed to phase locked and delay locked loops and, more particularly, to the delay line used in such loops.

2. Description of the Background

A phase locked loop is a circuit designed to minimize the phase difference between two signals. When the phase difference approaches zero, or is within a specified tolerance, the phase of the two signals is said to be "locked". A delay locked loop is similar to a phase locked loop, but instead of producing an output signal which has the same phase as an input or reference signal, the delay locked loop passes a reference signal or input signal into a delay line, and the output of the delay line has some predefined phase delay with respect to the reference or input signal.

Phase locked loops (PLL's) and delay locked loops (DLL's) are widely used circuit where it is necessary to have two signals which have a known relationship to one another. For example, when transmitting information from a sending device to a receiving device, it is necessary to have the local clock of the receiving device in sync with the clock of the sending device so that the information can be reliably transmitted. A PLL may be used for that purpose. Both PLL's and DLL's have been used for a long period of time, and numerous analog examples of these circuits can be found in the literature and in many devices.

Both PLL's and DLL's may be implemented either by analog components or digital components. In an analog loop, a delay chain is used to adjust delay and each element in the delay chain has its delay varied by analog bias voltages supplied by a phase detector. In a digital loop, rather than adjust the delay of, for example, a transistor, the delay is adjusted based on the number of delay stages that are included in the delay chain. Analog loops have continuous delay adjustments whereas digital loops adjust delays in discreet steps. As a result, one advantage of an analog loop is that the jitter is very low compared to the step jitter of a digital loop.

It is also known to implement loops in phases. For example, U.S. Pat. No. 6,445,231 entitled Digital Dual-Loop DLL Design Using Coarse and Fine Loops illustrates a circuit in which the delay line is comprised of both a coarse loop and a fine loop. The coarse loop is designed to produce an output signal having a phase variation from an input signal within a coarse delay stage while the fine loop is designed to produce an output signal having a phase deviation from the input signal which is substantially smaller than the deviation of the coarse loop. The coarse loop is designed to bring the output signal to a near phase lock condition, or phase delayed condition, while the fine loop is designed to achieve a locked condition. Thus, a dual-loop (coarse and fine loops) all digital PLL or DLL can provide a wide lock range while at the same time still providing a tight lock within reasonable time parameters.

There are several ways to implement the fine delay tap used in a fine loop. For example, one implementation embodies load-adjusting using a variable load capacitors. Another implementation is to provide both a fast path and a slow path using slightly different sized devices. The first method has little intrinsic delay and almost constant delay over process, voltage and temperature (PVT) variations. In contrast, the second method has a large intrinsic delay but provides better tracking for delay variations. Thus, a tradeoff must be made which is driven by the design parameters of the final device. Accordingly, a need exists for a DLL and PLL that have a large locking range, tight locking characteristics, little intrinsic delay, low power distribution and good tracking over PVT variations.

SUMMARY OF THE PRESENT INVENTION

The present invention is directed to an interleaved delay line for use in phase locked and delay locked loops. The present invention is comprised of a first portion providing a variable amount of delay substantially independently of process, temperature and voltage (PVT) variations while a second portion, in series with the first portion, provides a variable amount of delay that substantially tracks changes in process, temperature, and voltage variations. By combining, or interleaving, the two types of delay, single and multiple locked loops constructed using the present invention achieve a desired jitter performance under PVT variations, dynamically track the delay variations of one coarse delay stage without a large number of fine delay taps, and provide for quick and tight locking. Those, and other advantages and benefits, will be apparent from the Description of the Preferred Embodiment appearing hereinbelow. Methods of operating delay lines and locked loops are also disclosed.

BRIEF DESCRIPTION OF THE DRAWINGS

For the present invention to be easily understood and readily practiced, the present invention will now be described, for purposes of illustration and not limitation, in conjunction with the following figures, wherein.

DESCRIPTION OF THE PREFERRED EMBODIMENTS

Figure 1:
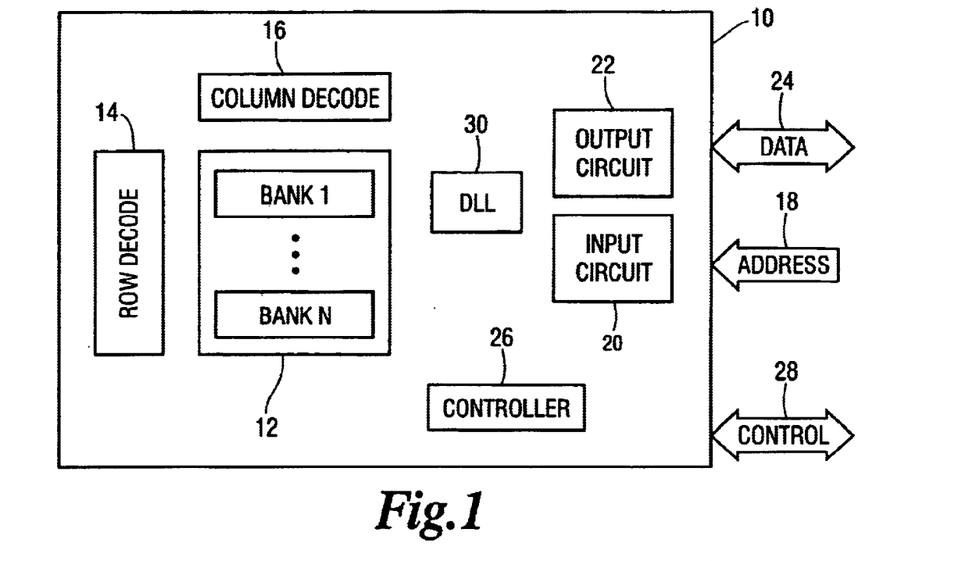
FIG. 1 is a block diagram of a memory device in which a DLL having an interleaved delay line constructed according to the teachings of the present invention may be used.

The present invention will now be described in conjunction with FIG. 1 which illustrates a memory device 10. The reader will understand that the description of the present invention in conjunction with the memory 10 of FIG. 1 is merely for the purpose of providing one example of an application for the present invention. The present invention is not to be limited to the application shown if FIG. 1.

The memory device 10 includes, by way of example and not limitation, a synchronous dynamic random access memory device (SDRAM). As shown in FIG. 1, memory device 10 includes a main memory 12. Main memory 12 typically includes dynamic random access memory (DRAM) devices which include one or more memory banks, indicated by BANK 1–BANK N. Each of the memory banks BANK 1–N includes a plurality of memory cells arranged in rows and columns. Row decode 14 and column decode 16 access the rows and columns, respectively, in response to an address, provided on address bus 18 by an external controller (not shown), such as a microprocessor. An input circuit 20 and an output circuit 22 connect to a data bus 24, for bi-directional data communication with main memory 12. A memory controller 26 controls data communication between the memory 10 and external devices by responding to an input or reference clock signal (CLKref) and control signals provided on control lines 28. The control signals include, but are not limited to, Chip Select (CS*), Row Access Strobe (RAS*), Column Access Strobe (CAS*), Write Enable (WE*), and Clock Enable (CKE).

A digital locked loop DLL 30, constructed according to the teaching of the present invention, connects to input circuit 20 and output circuit 22 for performing a timing adjustment, such as skew elimination or clock synchronization between two clock signals. While the invention is described in the context of a DLL, the present invention is applicable to any type of PLL. According to the teachings of the present invention DLL 30 is an all digital loop. Those skilled in the art will readily recognize that the memory device 10 of FIG. 1 is simplified to illustrate the present invention and is not intended to be a detailed description of all of the features of a memory device.

Figure 2:
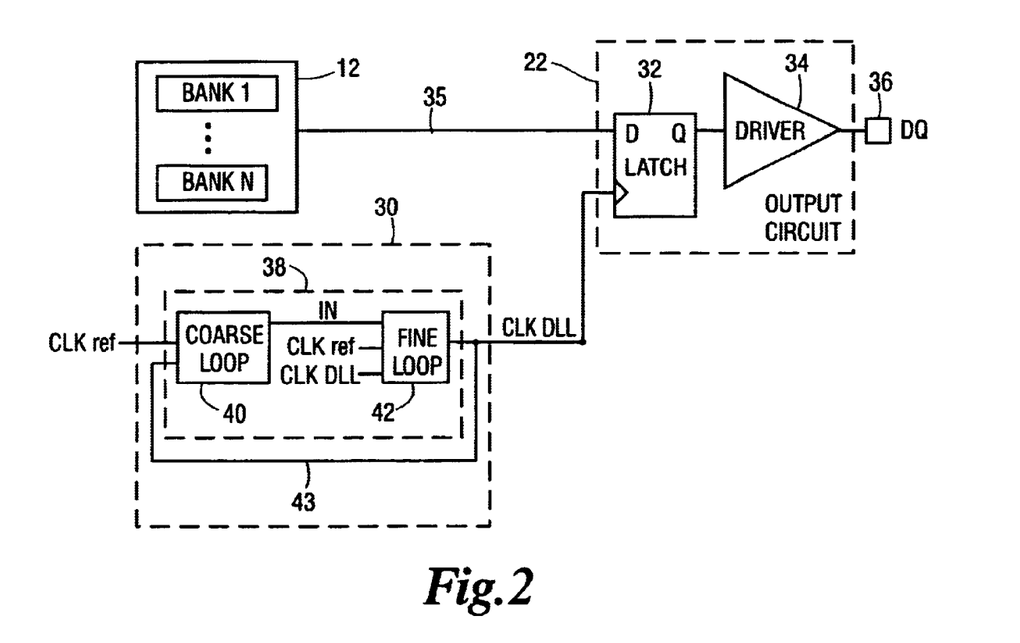
FIG. 2 is a block diagram of the DLL of FIG. 1 in conjunction with certain components of the memory device.

FIG. 2 is a block diagram illustrating a portion of memory device 10 of FIG. 1 including main memory 12, dual-loop DLL 30 and output circuit 22. Output circuit 22 includes an output latch 32 connected to an output driver 34. Output latch 32 is connected to main memory 12 via connection line 35. Output driver 34 is connected to an output pad 36 which provides a data output signal DQ.

DLL 30 includes a forward path 38 having a first loop or coarse loop 40 connected to a second loop or fine loop 42. In one embodiment, coarse loop 40 has a delay range up to 20 ns (nanosecond) to provide a wide frequency lock range. Fine loop 42 has a delay range from about 1 to 1.2 ns to provide a tight locking. Coarse loop 40 receives an input clock signal CLKref and a local clock signal CLK DLL on a feedback path 43. Fine loop 42 is responsive to coarse loop 40. Fine loop 42 also receives the CLKref signal and CLK DLL signal. Fine loop 42 outputs the local clock signal CLK DLL.

In a register-based all digital DLL, the phase jitter is primarily determined by the basic delay stage used in the delay line. Depending on the variations of process, supply voltage and temperature (PVT), the delay for one stage may vary from 130 ps to 350 ps. In a high-speed memory system, this skew has to be further reduced to ensure proper timing and valid data windows. The dual loop embodiment illustrated in FIG. 2 can be used to reduce the skew. The fine loop 42 can be used to provide fine delay interpolation and skew reduction after the coarse loop 40 is locked.

Figure 3:
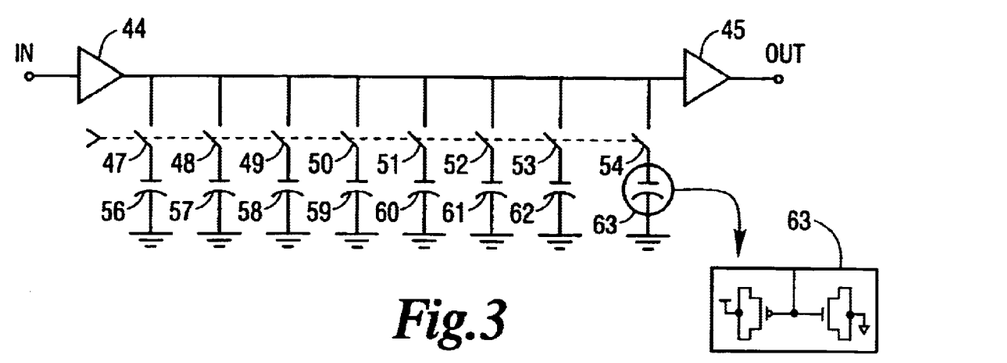
FIGS. 3 and 4 illustrate two methods of implementing delay interpolation for the fine loop of a delay line.
Figure 4:
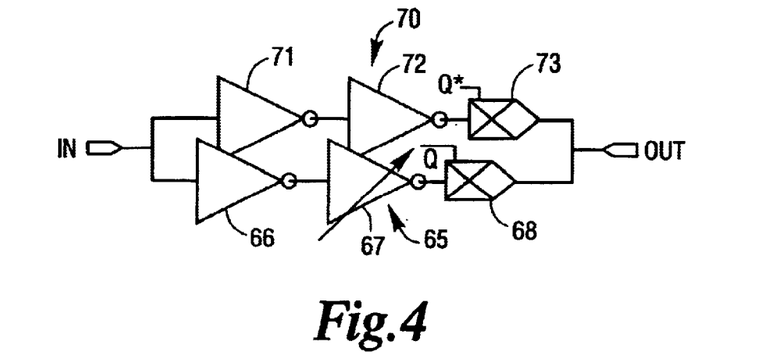

There are several ways to implement a fine delay line with a small delay resolution. FIGS. 3 and 4 illustrate two methods. FIG. 3 illustrates a method involving eight taps with which the load is adjusted while FIG. 4 illustrates a method involving a single tap with fast and slow paths.

The method in FIG. 3 employs a pair of series connected inverters 44 and 45. The load can be adjusted through operation of switches 47–54 which can be used to switch capacitors 56–63 into the circuit. An implementation for one of the capacitors, capacitor 63, is also illustrated. Each of the capacitors 56–63 may be implemented in a similar manner. The capacitor 63 is implemented through a pair of n-channel and p-channel transistors with their gate terminals connected together and, in the case of the p-channel device, the remaining terminals connected to a voltage source (e.g. $V_{DD}$) and, in the case of the n-channel device, the source and drain terminals are is connected to ground. By adding or removing the capacitors 56–63, a delay can be achieved that can be increased or decreased in a step-wise fashion. That delay is almost constant over PVT variations. The method of FIG. 3 has a very small, e.g. 0.3 ns intrinsic delay. Here, intrinsic delay refers to the initial delay added to the loop when a fine loop is used. The intrinsic delay will slow down the loop operation which is generally not a good feature.

The embodiment illustrated in FIG. 4 includes a slow path 65 which is comprised of a first inverter 66, a second inverter 67, and a multiplexer 68. A fast path 70 is similarly comprised of a first inverter 71, a second inverter 72, and multiplexer 73. By varying the size of the inverter in the slow path 65, a different delay resolution can be achieved. Thus, the embodiment of FIG. 4 utilizes different paths to achieve a verniered delay. In contrast to the embodiment of FIG. 3, the delay varies with, or tracks, the variations in PVT, i.e. increasing in the slow corners and decreasing in the fast corners. However, a large intrinsic delay is introduced because of the two inverters and the multiplexer for each delay tap (0.3 ns per tap).

An interleaved delay line constructed according to the present invention is designed to use both delay interpolation methods to achieve:

(1) desired jitter performance under PVT variations;

(2) dynamic tracking of the delay variations without a large number of delay taps; and (3) quick and tight locking.

Figure 5:
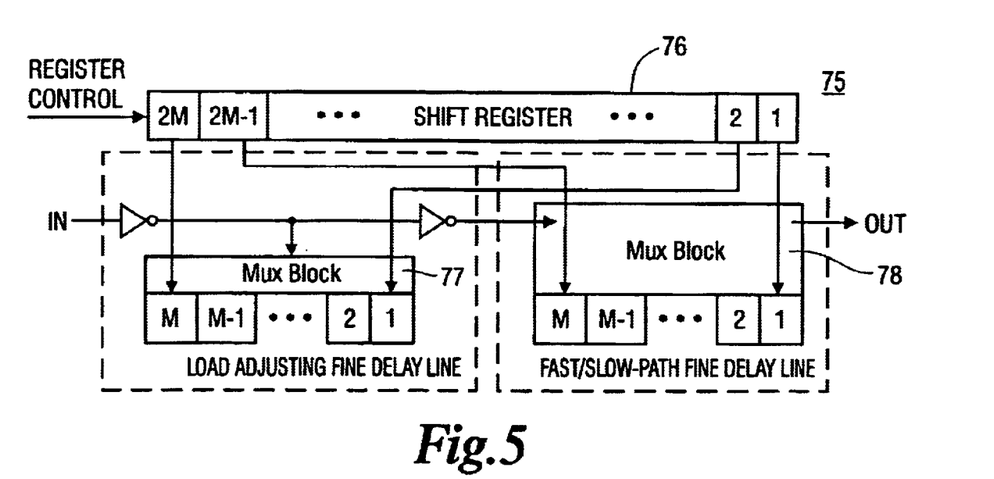
FIG. 5 is a block diagram illustrating an interleaved delay line implementing the methods shown in FIGS. 3 and 4.

A block diagram of such an interleaved delay line 75 is shown in FIG. 5. A shift register 76 in combination with multiplexers 77 and 78 forms a control circuit that is used to select different delay taps with the delay taps being selected alternately from the delay line comprised of load adjusting taps and the delay line comprised of fast/slow-path taps. Initially, half of these delay taps are selected which gives an M-tap tuning range for increasing or decreasing the delay. This arrangement gives more flexibility to eliminate the skew and other timing errors under PVT variations.

Figure 6:
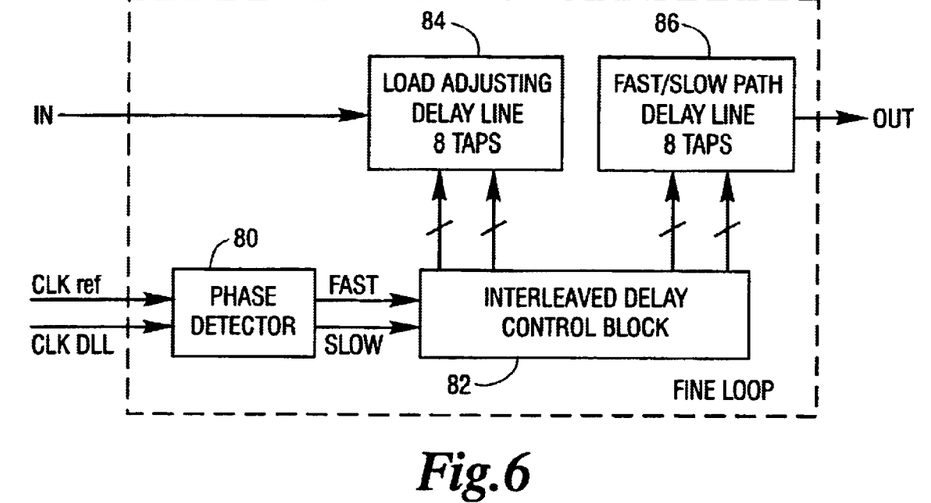
FIG. 6 illustrates a circuit for implementing a locked loop having an interleaved delay line.

FIG. 6 illustrates a circuit for implementing the interleaved delay line 75 of FIG. 5. In FIG. 6, a phase detector 80 receives the signals CLKref, CLK DLL. The phase detector circuit 78 produces a FAST control signal and a SLOW control signal which are each comprised of pulses. The number of pulses in the FAST and SLOW control signals is representative of the difference in phase between the signals CLKref and CLK DLL. The FAST control signal is used for advancing the phase of the signal CLK DLL while the SLOW control signal is used to retard the phase of the signal CLK DLL. The FAST and SLOW control signals are input to a control block 82. The control block 82 outputs signals to control the capacitive load of variable delay line 84 and to control the number of fast and slow paths connected in variable delay line 86. The variable delay line 84 may be constructed as illustrated in FIG. 3 while the variable delay line 86 may be constructed as illustrated in FIG. 4. The signal OUT (which is the signal CLK DLL) is input via a feedback path, not shown, to the phase detector 80. A coarse locked loop is typically added in front of delay line 84, such that the delay line 84 is responsive to the coarse locked loop and the signal CLK DLL is input to the coarse locked loop. Through the implementation illustrated in FIG. 6, the advantages of both the variable delay line 84 and variable delay line 86 can be obtained.

In an exemplary embodiment, eight delay taps (M=8) were used for each delay line and the typical delay of the load-adjusting tap for delay line 84 was approximately 30 ps ($t_{dl}$), although the delay varied from 25 ps to 35 ps.

For the fast/slow variable delay line 86, a typical delay for each stage was about 50 ps ($t_{dp}$) with a range of 35 ps–70 ps (per tap). The tuning range of this interleaved delay line can be calculated as:

$$t_{tune} = \frac{M}{2}(t_{dl} + t_{dp})$$

For above given numbers, $t_{tune}$ works out to be 240 ps < $t_{tune}$ < 420 ps which covers the coarse delay per stage over PVT variations. The worst-case RMS jitter is below 35 ps and peak-to-peak jitter is less than 70 ps.

Figures 7, 7A:
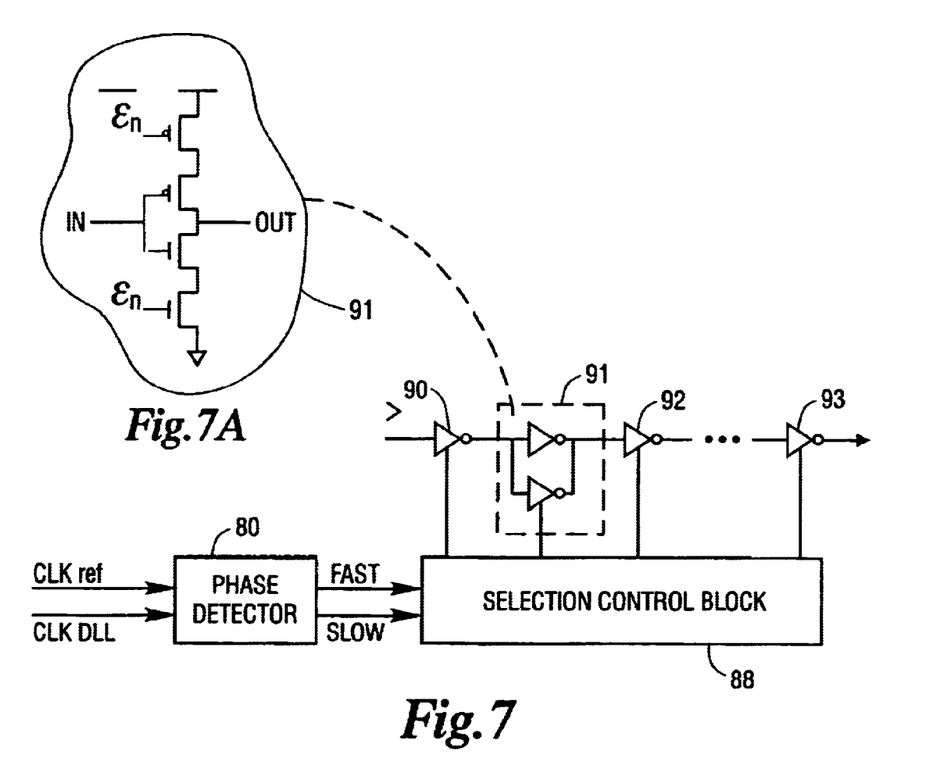
FIG. 7 illustrates another method of implementing delay interpolation for the fine loop of a delay line.

FIG. 7 illustrates another example of how the fine delay may be adjusted by adjusting the amount of drive. The phase detector 80 produces the FAST and SLOW control signals which are input to a selection control block 88. The selection control block 88 produces signals for controlling individual drive stages 90, 91, 92, 93. One of the drive stages, drive stage 91, is illustrated as a pair of parallel connected inverters, and one of the inverters is illustrated in detail in FIG. 7A. Thus, the selection control block 88 determines if one or both paths within drive stages 90, 91, 92, 93 are used.

The following table compares the three types of delay discussed; namely, the load adjusting delay of FIG. 3, the drive adjusting delay of FIG. 7, and the fast/slow path adjustment of FIG. 4.

| DELAY INTER-POLATION | DELAY TAP | $T_D$ (FAST) | $T_D$ (TYP-ICAL) | $T_D$ (SLOW) | INTRINSIC DELAY (TYPICAL) |
|---|---|---|---|---|---|
| Load Adjusting (1) | ncap & pcap | 27 ps | 34 ps | 38 ps | 300 ps |
| Drive Adjusting (2) | 2 inverters (in parallel) | 20 ps | 30 ps | 45 ps | 780 ps |
| Fast/Slow Path (3) | 2 inverters each path (in serial) & 1 MUX | 20 ps | 50 ps | 70 ps | 1750 ps |

An interleaved fine delay line can use any two of these three methods to achieve fast and tight locks. It is possible that if the last two methods are used, situations may arise in which the delay is varied nonlinearly as shown in the simulation results of FIGS. 8A, 8B and 8C. Under those circumstances, duty cycle distortion of the output may occur. In terms of power distribution, the load adjusting delay is the best whereas the fast/slow path adjustment is the worst.

Figure 8A:
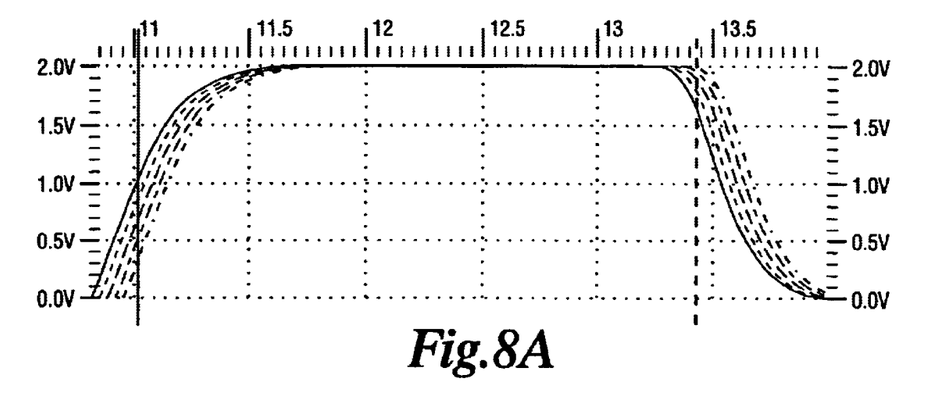
FIGS. 8A, 8B and 8C are simulations of the delay adjustment of the embodiments of FIGS. 3, 7 and 4, respectively.
Figure 8B:
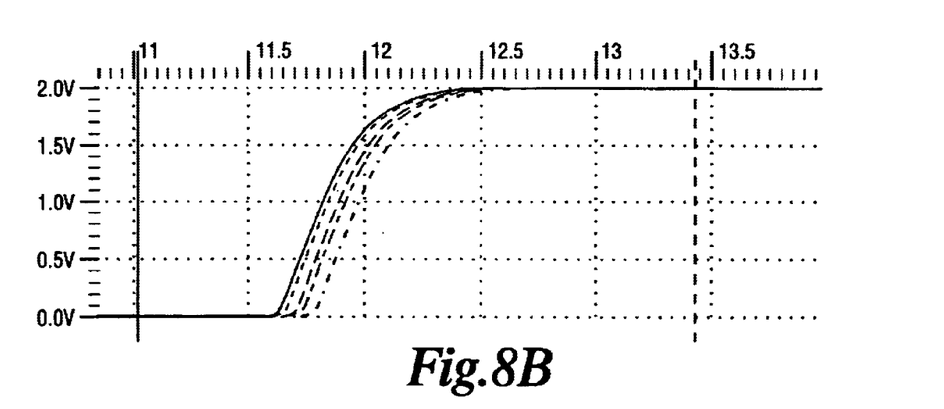
Figure 8C:
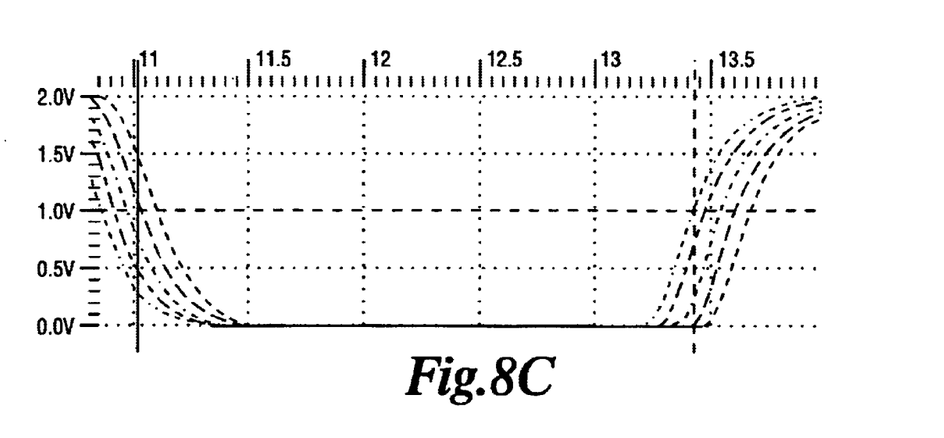

FIGS. 8A, 8B and 8C are simulations based on using the load adjusting method of FIG. 3, the drive adjusting method of FIG. 7, and the fast/slow path method of FIG. 4, respectively.

Figure 9:
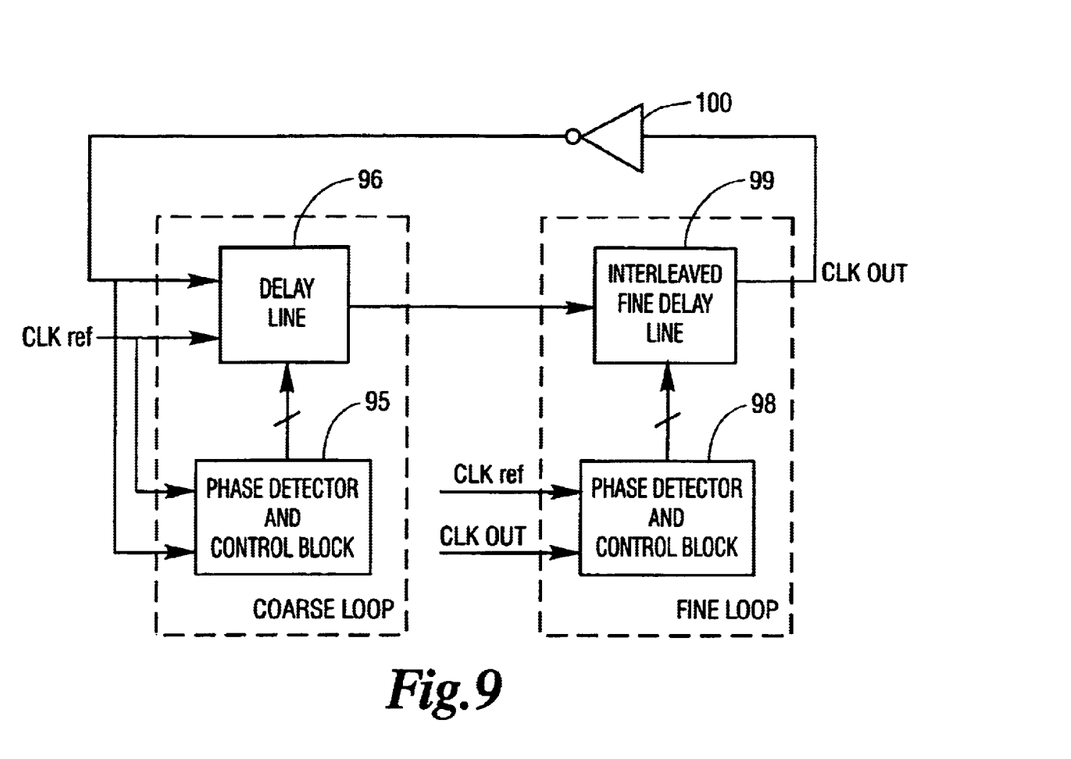
FIG. 9 illustrates the present invention used in a phase locked loop.

While the present invention has been described in the context of a delay locked loop, the present invention may also be utilized in a phase lock loop as illustrated in FIG. 9. In FIG. 9, a course loop is comprised of a phase detector and control block 95 which controls a delay line 96. The fine loop is comprised of a phase detector and control block 98 which controls an interleaved fine delay line 99 of the type, for example, illustrated in FIG. 6. The output of the interleaved fine delay line 99 is input to the delay line 96 through a digitally controlled oscillator 100.

Figure 10:
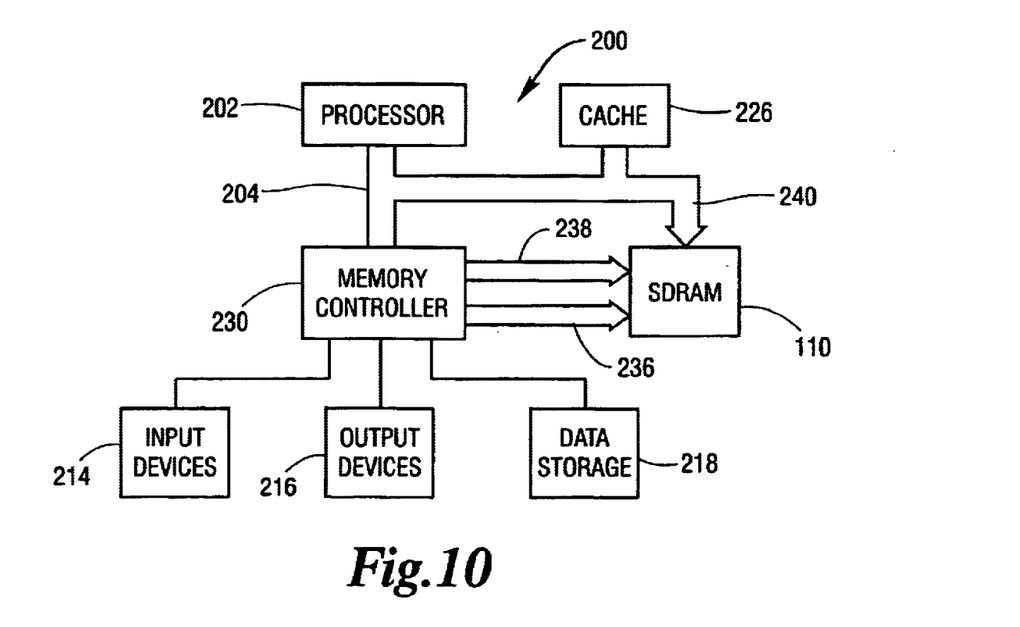
FIG. 10 is a block diagram of a computer system using the memory device of FIG. 1.

FIG. 10 illustrates a computer system 200 containing the SDRAM 10 of FIG. 1 using the present invention. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 110 through a memory controller 230. The memory controller 230 normally includes a control bus 236 and an address bus 238 that are coupled to the SDRAM 110. A data bus 240 may be coupled to the processor bus 204 either directly (as shown), through the memory controller 230, or by some other means.

While the present invention has been described in connection with exemplary embodiments thereof, those of ordinary skill in the art will recognize that many modifications and variation are possible. Such modifications and variations are intended to be within the scope of the present invention, which is limited only by the following claims.

What is claimed is:

1. A memory device, comprising:
    a plurality of memory cells;
    circuits, clocked by a local clock signal, for writing information into and reading information out of said memory cells; and
    a dual locked loop for locking said local clock signal to an external reference signal, comprising:
    a first locked loop for establishing a phase relationship between said local clock signal and said reference signal; and
    a second locked loop responsive to said first locked loop and comprising:
    a delay line having a first portion providing a variable amount of delay substantially independently of process, temperature and voltage variations and a second portion in series with said first portion and providing a variable amount of delay that substantially tracks changes in process, temperature, and voltage variations;

a control circuit for controlling the delay of said delay line;

a phase detector for producing signals for input to said control circuit; and a feedback path for connecting an output of said delay line to an input of said first locked loop and to said phase detector, said local clock signal being available at said output of said delay line.

2. A memory device, comprising:

a plurality of memory cells;

circuits, clocked by a local clock signal, for writing information into and reading information out of said memory cells; and a dual locked loop for locking said local clock signal to an external reference signal, comprising:

a first locked loop for establishing a phase relationship between said local clock signal and said reference signal; and a second locked loop responsive to said first locked loop and comprising:

a delay line having a first portion providing a variable amount of delay with little intrinsic delay and a second portion in series with said first portion and providing a variable amount of delay with a larger intrinsic delay;

a control circuit for controlling the delay of said delay line;

a phase detector for producing signals for input to said control circuit; and a feedback path for connecting an output of said delay line to an input of said first locked loop and to said phase detector, said local clock signal being available at said output of said delay line.

3. A memory device, comprising:

a plurality of memory cells;

circuits, clocked by a local clock signal, for writing information into and reading information out of said memory cells; and a dual locked loop for locking said local clock signal to an external reference signal, comprising:

a first locked loop for establishing a phase relationship between said local clock signal and said reference signal; and a second locked loop responsive to said first locked loop and comprising:

a first circuit path having a stepwise variable capacitive load;

a second circuit path in series with the first circuit path and having a plurality of stages each having at least two paths;

a control circuit for controlling the amount of capacitance in said first circuit path and the number of stages in said second circuit path;

a phase detector for producing signals for input to said control circuit; and a feedback path for connecting an output of said delay line to an input of said first locked loop and to said phase detector, said local clock signal being available at said output of said second locked loop.

4. A memory device, comprising:

a plurality of memory cells;

circuits, clocked by a local clock signal, for writing information into and reading information out of said memory cells; and a dual locked loop for locking said local clock signal to an external reference signal, comprising:

a first locked loop for establishing a phase relationship between said local clock signal and said reference signal; and a second locked loop responsive to said first locked loop and comprising:

a first circuit path having a stepwise variable capacitive load and a second circuit path in series with said first circuit path and having a plurality of stages each having a variable amount of drive associated therewith;

a control circuit for controlling the amount of capacitance in said first circuit path and the number of stages in said second circuit path;

a phase detector for producing signals for input to said control circuit; and a feedback path for connecting an output of said second locked loop to an input of said first locked loop and to said phase detector, said output signal being available at said output of said second locked loop.

5. A memory device, comprising:

a plurality of memory cells;

circuits, clocked by a local clock signal, for writing information into and reading information out of said memory cells; and a dual locked loop for locking said local clock signal to an external reference signal, comprising:

a first locked loop for establishing a phase relationship between said local clock signal and said reference signal; and a second locked loop responsive to said first locked loop and comprising:

a first circuit path having a plurality of stages each having a variable amount of drive associated therewith and a second circuit path in series with said first circuit path and having a plurality of stages each having at least a fast and a slow path;

a control circuit for controlling the number of stages in said first circuit path and the number of fast paths and slow paths in said second circuit path;

a phase detector for producing signals for input to said control circuit; and a feedback path for connecting an output of said second circuit to an input of said first circuit and to said phase detector.

* * * * *

UNITED STATES PATENT AND TRADEMARK OFFICE
CERTIFICATE OF CORRECTION

| | |
|---|---|
| PATENT NO. | : 6,912,666 B2 |
| APPLICATION NO. | : 10/731779 |
| DATED | : June 28, 2005 |
| INVENTOR(S) | : Feng Lin |

Page 1 of 1

It is certified that error appears in the above-identified patent and that said Letters Patent is hereby corrected as shown below:

Column 3, Line 5, delete "if" and substitute therefore --in--.

Column 4, Line 17, delete "are is" and substitute therefore --is--.

Column 5, Lines 27-28, the formula should appear as follows:

$$240\ ps < t_{tune} < 420\ ps$$

Signed and Sealed this

Seventeenth Day of March, 2009

JOHN DOLL
*Acting Director of the United States Patent and Trademark Office*